United States Patent [19]

Huber et al.

[11] 3,874,937

[45] Apr. 1, 1975

[54] METHOD FOR MANUFACTURING METAL OXIDE SEMICONDUCTOR INTEGRATED CIRCUIT OF REDUCED SIZE

[75] Inventors: Robert J. Huber, Bountiful; Kent F. Smith, Salt Lake City, both of Utah

[73] Assignee: General Instrument Corporation, Newark, N.J.

[22] Filed: Oct. 31, 1973

[21] Appl. No.: 411,444

[52] U.S. Cl. .................................. 148/1.5, 145/187
[51] Int. Cl. .............................................. H01l 7/54
[58] Field of Search ............................. 148/1.5, 187

[56] References Cited

UNITED STATES PATENTS 3,650,019 3/1972 Robinson ......................... 148/1.5 X
3,653,978 4/1972 Robinson et al ..................... 148/1.5

*Primary Examiner*—L. Dewayne Rutledge
*Assistant Examiner*—J. M. Davis

[57] ABSTRACT

A metal oxide semiconductor integrated circuit of reduced size and a method for manufacturing same wherein the size reduction results from the elimination of the usual dimensional tolerances on the width of the gate electrode of the transistors therein. Misalignment of the gate electrode along the width of the underlying thin insulating layer of the channel region, which normally causes degraded performance, is compensated for by implanting ions of the same conductivity determining type as the original substrate in the channel region beneath the areas of the thin insulating layer exposed by the misalignment. No additional masking operation is necessary. The implanted ions prevent the formation of an uncontrollable conducting path between the source and drain regions normally caused by this misalignment, thus eliminating the necessity for the use of an oversized gate electrode to insure that exposed areas of the thin insulating layer are not present. The use of smaller gate electrodes substantially reduces the size of the transistors and therefore the entire circuit.

15 Claims, 34 Drawing Figures

A METHOD FOR MANUFACTURING METAL OXIDE SEMICONDUCTOR INTEGRATED CIRCUIT OF REDUCED SIZE

The present invention relates to metal oxide semiconductor integrated circuit technology and more particularly to a metal oxide semiconductor integrated circuit of reduced size and a method for manufacturing same.

A metal oxide semiconductor integrated circuit comprises an array of circuit elements, some of which are usually metal oxide semiconductor field effect transistors (MOSFETS) formed on a single substrate and interconnected to perform a specific function. Many different procedures have been designed for manufacturing MOSFETS on a substrate.

Basically, all of these processes form the MOSFET by doping a monocrystalline silicon substrate of a first conductivity type with second conductivity determining type impurities to form separate and distinct source and drain regins in the substrate. This is normally accomplished by forming a thin insulating layer, preferably of silicon dioxide on the substrate. A photoresist layer is then formed on the dioxide layer and an accurately formed mask is placed over the photoresist layer. The unit is then exposed to an ultraviolet light source to polymerize the exposed photoresist. The mask is removed and the unexposed portions of the photoresist layer are washed away by a suitable solvent to expose two areas of the insulating layer. The exposed areas of the insulating layer are removed by the appropriate solution and the polymerized photoresist is then removed. Impurities are doped into the exposed areas of the silicon through the windows in the insulating layer forming the source and drain and then the insulating layer is partially removed.

The portion of the substrate between the source and drain regions is referred to as the channel region. The channel region has a length equal to the distance between the source and the drain and a width equal to the extent of the interface between the source or the drain, on the one hand, and the channel region on the other.

A thick insulating layer, preferably composed of silicon dioxide, is then formed over the entire substrate. A second masking procedure is carried out to expose the channel region and form contact holes in the source and drain regions. The thin insulating layer is then regrown in the channel region to form the gate insulation and in the contact hole regions. A third mask is utilized to reopen the contact holes in the source and drain regions. A metallic material is deposited over the substrate and a fourth mask is utilized to delineate the metallization pattern. Alignment of the fourth mask with the layers already on the substrate is critical because the gate electrode must be at least as long as the channel length and extend from the source to the drain with no intervening uncovered regions if the transistor is to function properly. Further, if the gate electrode is not as wide as the channel width, or if it is misaligned and does not extend completely over the channel width, the transistor may function with severely degraded properties.

As can be readily appreciated, the manufacturing procedure depends on the correct registration of the various layers which form the semiconductor. Alignment of the layers must be accurate, not only with respect to the substrate, but particularly with respect to each other. Since the position of the mask determines the alignment of the layer associated therewith, alignment of the various masks with respect to each other is critical. However, because the masks for different layers are utilized at different points in the procedure, absolute alignment is impossible. In fact, there are always unpredictable variations in the precision with which one mask, and hence the layer associated therewith, can be placed relative to another.

Unfortunately, there are instances in which no misalignment between layers can be tolerated. For instance, in order to achieve a workable enhancement mode MOSFET, it has up until now been thought to be mandatory that the gate electrode extend over the entire length and width of the channel region. Therefore, in order to compensate for misalignments inherent in the manufacturing process, the gate electrode was normally formed substantially larger than the channel region to insure that the entire channel region would be covered. In the case of minimum sized transistors, this enlargement of the gate electrode may double the area required for the transistor. This, of course, causes each transistor to be considerably larger and therefore, in aggregate, the entire circuit takes up considerably more space. This is a great disadvantage in a technology where minimum size is of maximum importance.

It is, therefore, a prime object of the present invention to devise a metal oxide semiconductor integrated circuit and a method for manufacturing same wherein the size necessary for the integrated circuit is substantially reduced.

It is another object of the present invention to devise a metal oxide semiconductor integrated circuit of reduced size and a method for manufacturing same wherein the necessity for dimensional tolerances of the gate electrode along the width of the channel region are eliminated.

It is a further object of the present invention to devise a metal oxide semiconductor integrated circuit of reduced size and a method for manufacturing same in which the possibility of performance degradation due to gate misalignment is eliminated by preventing formation of an uncontrollable conducting path between the source and the drain region.

In accordance with the present invention the metal oxide semiconductors are exposed to an ion implanting procedure after the metallic layer has been etched into the desired gate pattern, but before any additional layers, such as protective overlying glass, are formed. High speed ions of the same conductivity determining type as the original substrate are made to impinge on the surface of the substrate. No additional masking operation is necessary in order to prevent the ions from affecting regions other than those which are exposed due to misalignment. Further, the relative thickness of the gate electrode prevents any of the ions from penetrating into the area of the channel region beneath the gate electrode. The speed of the ions is chosen such that the ions penetrate the thin exposed gate oxide and may be implanted in the substrate portions therebelow, but are not able to penetrate the thick insulating layer which covers the remaining portions of the surface of the circuit. Any ions which may be implanted in the insulating layers on the substrate are inoperative and do not effect the functioning of the transistor in any manner.

The implantation of the ions does not change the conductivity type of the substrate and particularly does not change the conductivity type of the region in which they are implanted. The effect of the implanted ions is merely to compensate for misalignment of the gate electrode by so modifying those portions of the substrate in the channel area not covered by the gate electrode as to render impossible the formation of an uncontrollable channel therein. This is accomplished by preventing the electric charge, which may migrate onto the exposed thin oxide region, from causing the formation of a conducting channel beneath the thin oxide.

Since the detrimental effect of the exposed thin oxide layers caused by misalignment of the gate electrode along the width of the channel region is eliminated, close tolerances along the width of the channel region are no longer necessary when forming the gate electrode. No matter where the area or areas of exposed thin insulating layers are situated, the impinging ions will penetrate into the substrate in these areas and compensate for the existence of these uncovered areas. The elimination of the width tolerance of the gate electrode substantially reduces the size of each semiconductor by eliminating the necessity for oversized gate electrodes, and therefore substantially reduces the area of the entire integrated circuit.

To the accomplishment of the above and to such other objects as may hereinafter appear, the present invention relates to a metal oxide semiconductor integrated circuit of reduced size and a method for manufacturing same as defined in the appended claims and as described in the specification, taken together with the accompanying drawings in which:

Figures 27, 28, 29, 30, 31, 32, 33, 34:
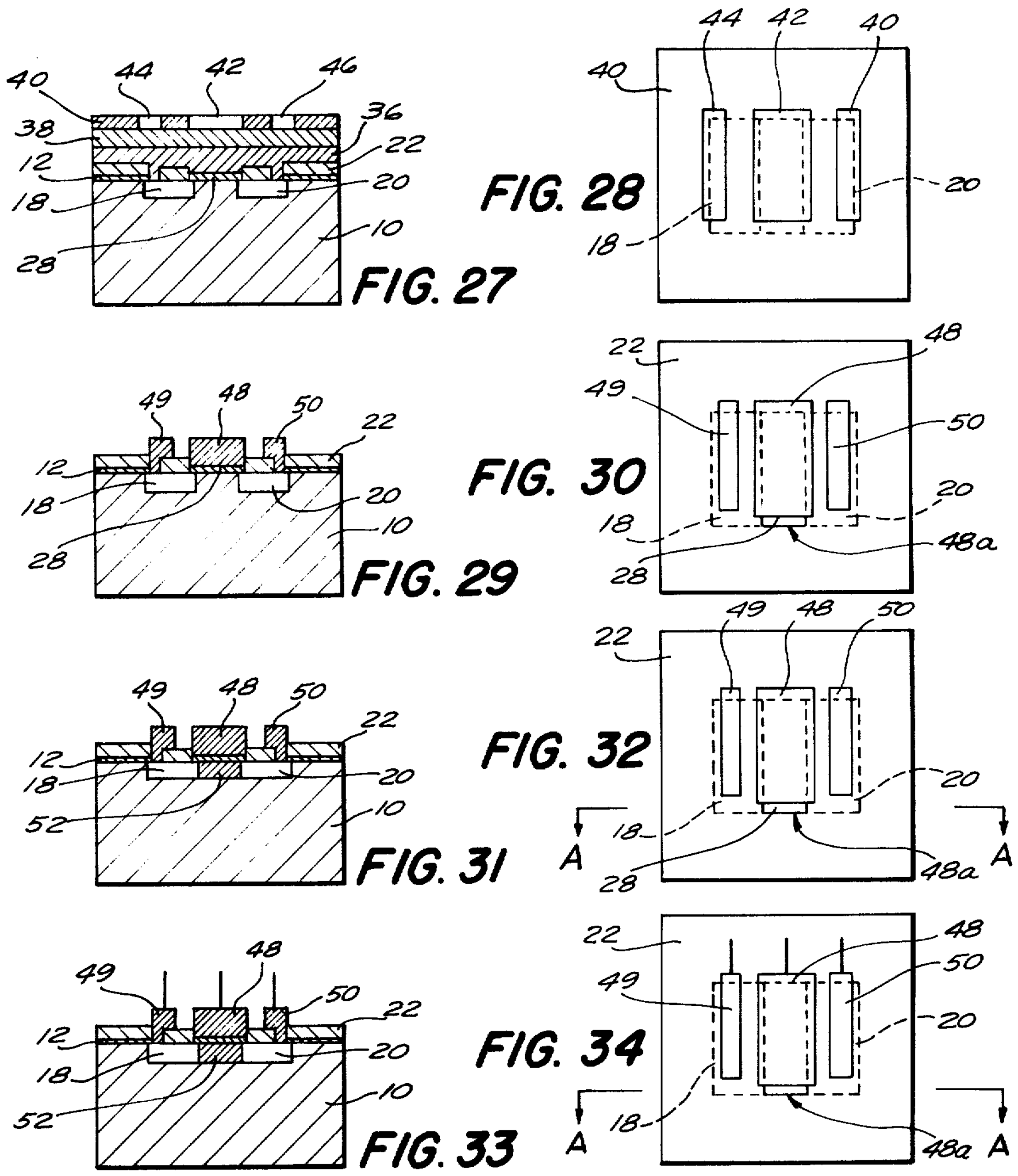
FIGS. 27 and 28 are views similar to FIGS. 25 and 26 respectively, but showing the unit after the metallization layer, fourth mask, and fourth photoresist layer have been placed thereon.
FIGS. 29 and 30 are views similar to FIGS. 27 and 28 respectively, showing the electrodes delineated.

FIGS. 31 and 32 are similar views to FIGS. 29 and 30 respectively, but wherein FIG. 31 is a cross-section taken along line A—A of FIG. 32 and shows the unit after ion implantation; and FIGS. 33 and 34 are views similar to FIGS. 31 and 32 respectively, but showing the leads formed on each of the electrodes.

The invention will be here specifically disclosed in conjunction with the formation of a single metal oxide semiconductor field effect transistor on a substrate. However, it should be obvious that the techniques disclosed herein in conjunction with the single transistor can be utilized simultaneously for all of the MOSFETS in the integrated circuit, if desired. The reduction in size which accompanies the manufacture of a single semiconductor by the process of the present invention, will, of course, be present to a much greater degree when utilized in conjunction with each transistor in the integrated circuit.

Figure 1:
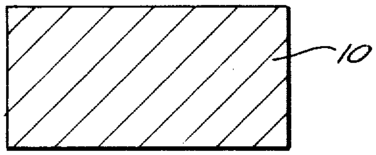
FIGS. 1 and 2 are schematic cross-sectional and top planned views respectively showing the substrate in its original condition ready for processing.
Figure 2:
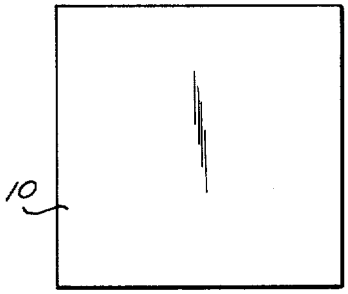

As shown in FIGS. 1 and 2, the MOSFET is formed of a substrate or wafer 10, preferably of monocrystalline silicon of the appropriate conductivity type. The wafer 10 is prepared by conventional slicing, polishing and cleaning techniques. Usually the wafer is lapped, cleaned, degreased and chemically etched to remove lapping damage on the surface in preparation for succeeding steps. For purposes of illustration, a P-type substrate has herein been chosen. However, the method of the present invention functions equally well with N-type substrates.

Figure 3:
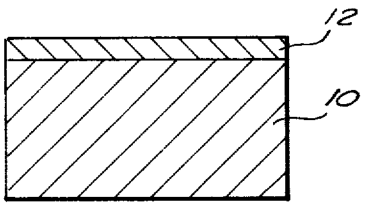
FIGS. 3 and 4 are views similar to FIGS. 1 and 2 respectively, but showing the thin insulating layer on the substrate.
Figure 4:
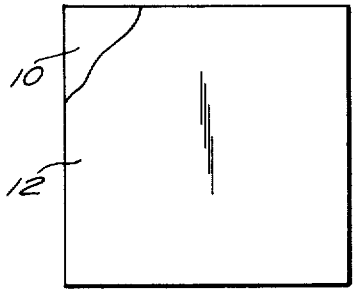

FIGS. 3 and 4 show substrate 10 after a thin insulating layer 12, preferably silicon dioxide, has been formed on the substrate. Such a layer may be formed, for example, by thermally oxidizing the wafer at between 850°C and 1150°C in a furnace in the presence of dry oxygen or water vapor as a suitable oxidizing agent. Generally this layer is from about a hundred to several thousand angstroms thick. Layer 12 will ultimately be used to mask wafer 10 during the doping operation.

Figure 5:
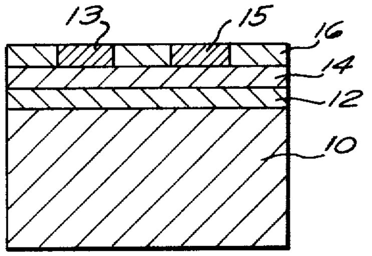
FIGS. 5 and 6 are views similar to FIGS. 3 and 4 respectively, but showing the photoresist layer and mask situated on the thin insulating layer.
Figure 6:
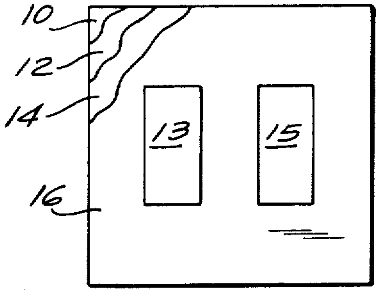

A layer 14 of photoresist is then formed on insulating layer 12. For example, KPR may be used which is a tradename for a product of the Eastman Kodak Company. Layer 14 is dryed and heated to form a hard emulsion. An accurately formed high resolution glass emulsion mask 16 is then placed in intimate contact with the top surface of layer 14 as seen in FIGS. 5 and 6. Mask 16 has two opaque portions 13, 15 therein corresponding to the desired position of the source and drain regions, respectively.

Figure 7:
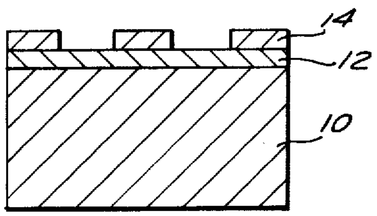
FIGS. 7 and 8 are similar views to FIGS. 5 and 6 respectively, but showing the photoresist layer after the unexposed portions have been washed away.
Figure 8:
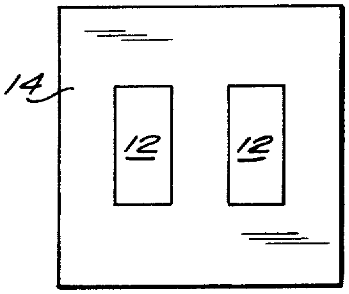

The unit is exposed to a collimated beam of ultraviolet light which polymerizes the exposed portions of the photoresist layer 14. The mask is taken off and the unpolymerized portions 13 and 15 of layer 14 are removed by the appropriate solvent such as xylene. The polymerized portions remain as an adherent etch-resistant pattern (FIGS. 7 and 8).

Figure 9:
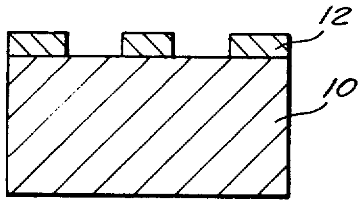
FIGS. 9 and 10 are similar views to FIGS. 7 and 8 respectively, but showing the insulating layer after it has been etched.
Figure 10:
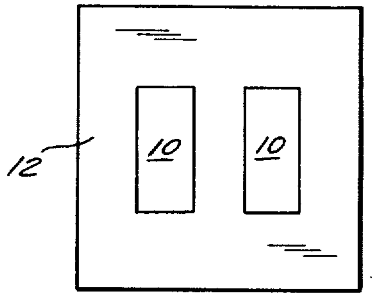
Figure 11:
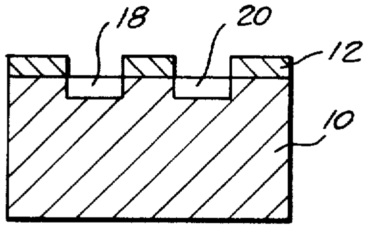
FIGS. 11 and 12 are views similar to FIGS. 9 and 10 respectively, but showing the unit after doping.
Figure 12:
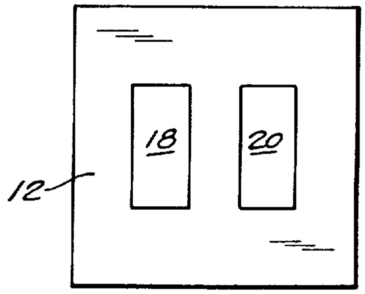

A solution of hydrofluoric acid is utilized to etch away the exposed portions of silicon dioxide layer 12 down to the substrate 10. The polymerized photoresist layer 14 is then removed by sulfuric acid (FIGS. 9 and 10). With the remaining portions of layer 12 as a mask, the unit is doped by conventional methods such as by using a phosphorus-containing substance as a source metered in a carrier gas which may contain oxygen to reduce pitting. Doping normally takes about 60 minutes at a temperature of 1150°C. The source 18 and drain 20 regions are thus formed (FIGS. 11 and 12).

Figure 13:
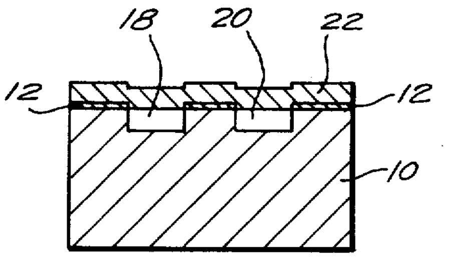
FIGS. 13 and 14 are views similar to FIGS. 11 and 12 respectively, but showing the thick insulating layer formed on the substrate.
Figure 14:
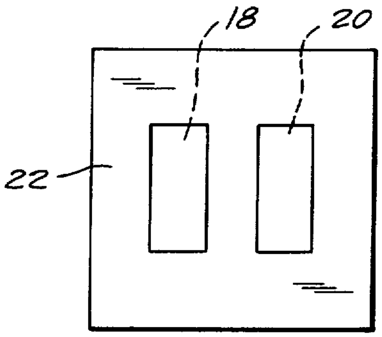

A portion of layer 12 is removed by hydrofluoric acid and a thick oxide layer 22, preferably silicon dioxide is formed over the substrate surface as by the methods described above for forming layer 12. Layer 22 is preferably 14,000 angstroms thick (FIGS. 13 and 14).

A second photoresist layer 24 and mask 26 having opaque portions 25, 27 and 29 are formed over insulating layer 22. The opaque region 25 of mask 26 corresponds to the channel region which has a length equal to the distance between the source 18 and drain 20 regions and a width equal to the interface between either the source 18 or drain 20 region on the one hand and the channel region on the other. Opaque regions 27 and 29 correspond to regions over the source 18 and drain 20 respectively in which the contact holes therefor are to be opened. The unit is again exposed to a beam of collimated ultraviolet light, mask 26 removed and the unexposed portions of layer 24 washed away as described above (FIGS. 17 and 18).

Figures 15, 16, 17, 18, 19, 20, 21, 22, 23, 24, 25, 26:
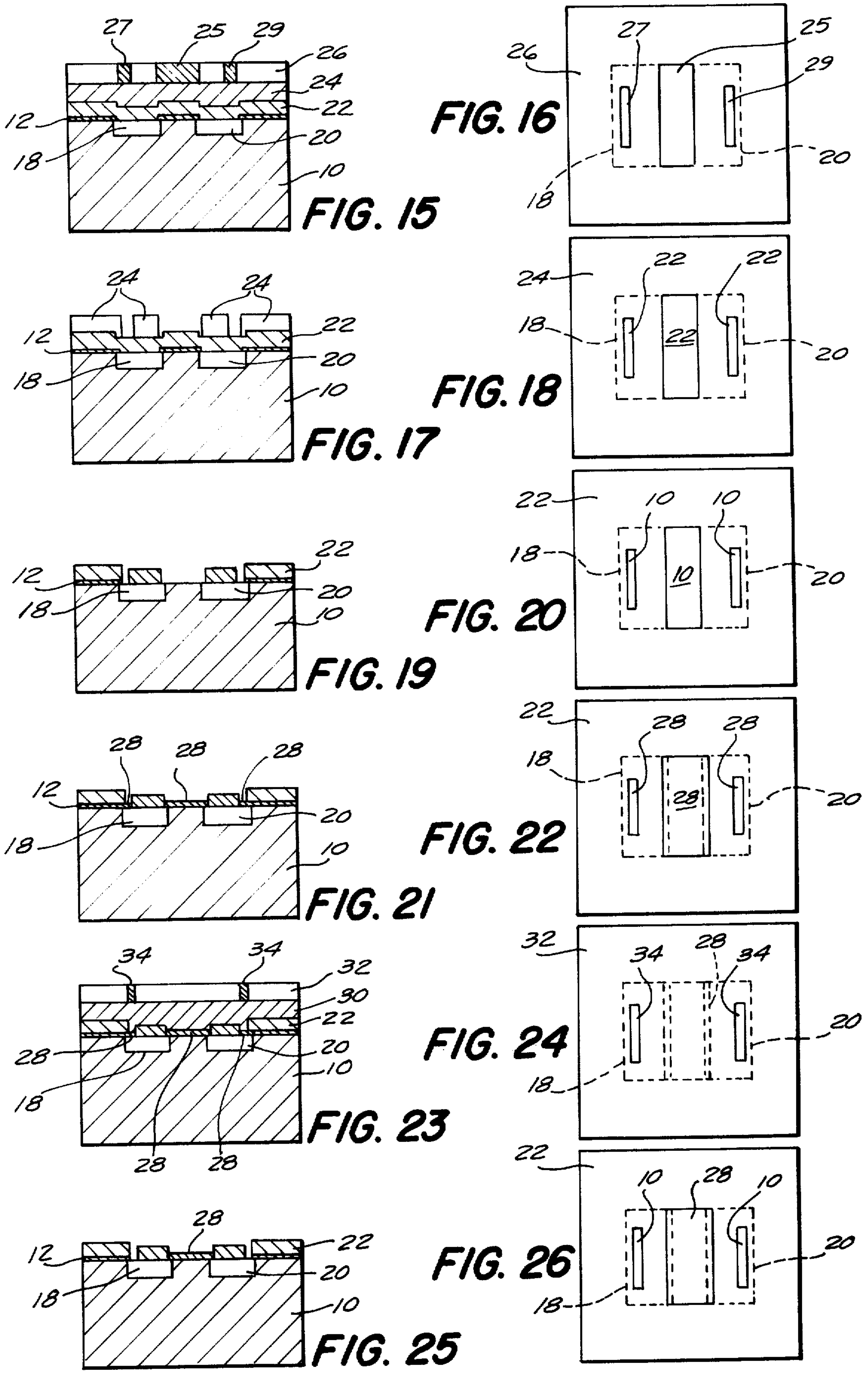
FIGS. 15 and 16 are similar views to FIGS. 13 and 14 respectively, but showing the second mask and the photoresist layer on the thick insulating layer.
FIGS. 17 and 18 are similar views to FIGS. 15 and 16 respectively, but showing the photoresist layer after the unexposed portions have been washed away and the mask removed.
FIGS. 19 and 20 are views similar to FIGS. 17 and 18 respectively, but showing the unit after the thick oxide layer has been etched and the remainder photoresist layer removed.
FIGS. 21 and 22 are views similar to FIGS. 19 and 20 respectively, but showing the unit after the second thin insulating layer is grown.
FIGS. 23 and 24 are views similar to FIGS. 21 and 22 respectively, but showing the unit after the third mask and photoresist layer have been placed thereon.
FIGS. 25 and 26 are similar views to FIGS. 23 and 24 respectively, but showing the unit after the thin insulating layer has been removed from the contact holes.

Next, the exposed regions of insulating layer 22 are removed in a conventional manner, such as by etching with a solution of hydrofluoric acid, the remaining portions of photoresist 24 acting as a mask for the removal process. Thus the gate region and contact holes for the source and drain regions are exposed. The remainder of the photoresist layer 24 is then removed by sulfuric acid, leaving the wafer as seen in FIGS. 19 and 20.

A second thin insulating layer 28 is then thermally regrown in the exposed portions of wafer 10, i.e. the gate and the contact hole regions in the source and drain. The wafer then appears as seen in FIGS. 21 and 22.

A third photoresist layer 30 is deposited over the wafer and a mask 32 having opaque portions 34 placed thereon. Opaque portions 34 correspond in position to the contact holes over the source and drain regions respectively, which were opened previously. The wafer then appears as seen in FIGS. 23 and 24.

The wafer is exposed to a beam of ultraviolet light, as described above, and mask 32 and the unexposed portions of layer 30 are removed. This again opens the contact holes down to the thin insulating layer 28 present therein. Layer 28 is removed from the contact holes in the source and drain regions thus exposing substrate 10 in these regions. This can be accomplished by the use of hydrofluoric acid or another appropriate substance. The remainder of photoresist layer 30 acts as a mask for the other portions of the wafer. The remainder of photoresist layer 30 is then removed and the wafer is left as shown in FIGS. 25 and 26. Note that layer 28 still remains in the channel region forming the gate insulating layer.

A layer 36 of conductive metallic material, such as aluminum, is deposited over the surface of the wafer.

On top of layer 36 is formed a fourth photoresist layer 38. A mask 40 is placed on the surface of layer 38 having a transparent portion 42 slightly longer than the length and approximately equal to the width of the channel region. Also, layer 38 has transparent portions 44 and 46 aligned with the contact holes in the source 18 and drain 20 regions respectively. As here illustrated, mask 40 is intentionally misaligned widthwise (up and down in FIG. 28) to illustrate non-criticality of the registration. As described previously, the unit is exposed to a beam of collimated ultraviolet light, the mask 40 removed, and the unexposed photoresist layer 36 washed away.

The appropriate etchant, such as sodium hydroxide, is utilized to remove the exposed areas of aluminum layer 38, and then the polymerized portion of layer 36 is removed as described above. Aluminum gate electrode 48 remains, but because of the misalignment of the mask 40, a small area 48*a* (exaggerated in the drawing) of the channel region along the width of the gate 48 remains uncovered (FIG. 30). This uncovered region 48*a* permits the exposure of a small area of insulating layer 28. Contacts 49 and 50 for source region 18 and drain region 20, respectively, are also formed.

Up to this point what has been described is an exemplary prior art technique for forming MOS transistors. Because mask 40 can never be aligned precisely with respect to the channel region, prior to the present invention it was thought necessary to make the transparent portion 42 of mask 40 substantially larger than the channel region lengthwise and widthwise to insure that gate electrode 48 would cover the entire channel region. It is still necessary, with some types of transistors, to insure that the gate electrode covers the entire length of the channel region without any uncovered areas therein. Because of this, the transparent portion 42 of mask 40 can be made somewhat longer than the length of the channel region such that any misalignment which may occur between the mask and the channel region along the length will be compensated for.

However, the present invention, as will be explained, permits the width of the transparent portion 42 of mask 40 to be equal to or even slightly shorter than the width of the channel region, as the alignemnt of the gate electrode along the width dimension of the channel region is no longer critical. This substantially reduces the size of the electrode and therefore the entire unit. As can be seen in FIG. 30, the misalignment and size of gate electrode 48 have caused a portion 48*a* of the thin insluating layer 28 to be exposed on the lower side of gate electrode 48. Because of inherent inaccuracies in masking techniques, the exposed region 48*a* cannot be prevented except through the use of oversized gate electrode 48. Up until now, the exposure of thin insulating layer 28 in the channel region has been thought to render the semiconductor defective because such an exposed area will permit charge to migrate beneath the exposed area from source region 18 to drain region 20 in a manner which cannot be controlled by the voltage applied to the gate electrode 48. This uncontrollable conducting path significantly degrades the performance characteristics of the semiconductor.

Through the use of the present invention it has become possible to eliminate the detrimental effects of such exposed thin insulating layers and therefore to prevent the formation of an uncontrollable conducting path between the source 18 and drain 20. Therefore, it has become possible to utilize a gate electrode which has a width which is approximately equal to the channel region without disrupting the characteristics of the semiconductor.

In order to eliminate the detrimental effects of the exposed thin insulating layer 28 in region 48a caused by the size and/or the misalignment of gate electrode 48, a stream of high speed ions of the same conductivity determining type as the original substrate 10 are directed on the surface of the unit. These ions penetrate the substrate 10 only in the area 48a exposed by gate misalignment. In this case, since the original substrate was P-type, boron ions are used. However, high speed ions of any appropriate element such as gallium or indium which will produce P-type regions in the substrate may be used. In the case where N-type substrate is originally used, phosphorus ions or any other ions producing N-type regions such as arsenic in the substrate can be utilized.

No additional masking operations are necessary in order to perform the ion implantation. The relative thickness of the gate electrode 48 prevents the penetration of the high speed ions into the area beneath the gate electrode 48. Further, the speed of the ions is chosen such that they are unable to penetrate the thick insulating layer 22 which surrounds the channel region and is present on the remaining portion of the unit. Therefore, the only areas which are affected by the impinging ions are those areas 48a beneath the thin insulating layer 28 which are exposed due to the misalignment of gate electrode 48 along the width of the channel region.

FIGS. 31 and 32 illustrate the unit subsequent to ion implantation. The implantation of the ions into substrate 10 through the exposed areas of the thin insulating layer 28 will produce P+ region 52 underlying the exposed areas of the thin insulating layer 28. This region 52 will be of the same conductivity type as the original substrate and will compensate for the misalignment of gate electrode 48 in the channel region by preventing the formation of an uncontrollable channel underneath the exposed thin oxide layer by producing a barrier to charge migration in that area.

The present invention works equally well whether exposed thin insulating layer 28 is present on both ends of the channel region, because the width of the gate electrode is slightly less than the width of the channel region, or on only one side of the channel region, caused by misalignment of the gate with the channel region. Due to the metallic characteristics of the gate electrode 48 and the speed chosen for the ions, the impining ions will automatically eliminate the detrimental effect of any area of exposed thin oxide layer 28, wherever it is situated on the unit. However, all other areas will remain unaffected. Therefore, dimensional tolerances along the width of the channel region are no longer critical. Because of this, a much smaller gate electrode can be used and the proper functioning of the transistor will still be insured. This, of course, substantially reduces the size of the transistor, and in aggregate substantially reduces the size of the integrated circuit.

Leads from the source, drain and gate electrodes (see FIGS. 33 and 34) are formed in a conventional manner and interconnected with the other circuit elements in the integrated circuit. At this point a protective overlayer may be deposited on the entire circuit to protect the circuit, if desired.

With the exception of the ion implantation step, which eliminates the deleterious effects of gate misalignment along the width of the channel region, the remainder of the manufacturing process described herein is well known in the art. This explanatory material is for illustration purposes to show one process in which the present invention may be utilized. The present invention can be utilized with many other types of fabrication processes presently used and it is believed that it will be compatible with fabrication processes yet to be discovered. The concept of this invention is not limited to the specific process herein described and should not be so construed. It is the broadest concept of the present invention upon which coverage is intended.

A single preferred embodiment of the present invention has been specifically disclosed herein for purposes of illustration. It is apparent that many variations and modifications may be made upon the specific method disclosed herein. It is intended to cover all of these variations and modifications which fall within the scope of this invention as defined by the appended claims.

We claim:

1. In a method of manufacturing a metal oxide semiconductor of the type formed by doping a substrate of a first conductivity type with second conductivity type determining impurities to form separate source and drain regions therein which are separated by a channel region having a length equal to the space between the source and the drain and a width equal to the interface between the source or drain and the channel region, having a thin insulating layer covering the channel region, a thick insulating layer covering the remainder of the substrate and a metallic gate electrode formed over the entire length and a portion only of the width of the channel region such that part of the thin insulating layer is exposed, the improvement comprising the step of implanting ions of the first conductivity determining type in the substrate at the areas covered by said exposed thin insulating layer to prevent an uncontrollable conducting path from forming between the source and the drain caused by the exposed insulating layer in the channel region.

2. The method according to claim 1 wherein the step of implanting the ions comprises regulating the speed of the ions impinging on said semiconductor such that the ions penetrate the thin exposed insulating layer but not the thick insulating layer or the gate electrode.

3. The method of claim 1 wherein said first conductivity type is N-type and wherein the ions are phosphorus ions.

4. The method of claim 1 wherein said first conductivity type is P-type and wherein the ions are boron ions.

5. A method of reducing the size of a metal oxide semiconductor integrated circuit array comprising the steps of doping a first conductivity type substrate with impurities of a second conductivity determining type to form a source and drain for each of the semiconductors in the array, each of said respective source and drain pairs being separated by a channel region whose length is equal to the space between each source and drain pairs and whose width is equal to the interface between either the source or the drain in said pairs and the channel region therebetween, forming a thin insulating layer over each of said channel regions, forming a thick insulating layer over the remainder of the substrate, forming a metal gate electrode on the thin insulating layer covering the length and a portion only of the width of each of the channel areas such that a portion of the thin insulating layer is exposed on each channel region and implanting ions of the first conductivity type in said substrate in the areas covered by said exposed portion of said thin insulating layer, thereby to prevent the formation of an uncontrollable conducting path between the source and the drain in each semiconductor caused by the exposed insulating layer and thus avoiding the necessity for overlapping of the gate electrodes along the width of each of the respective channel regions.

6. The method according to claim 5 wherein the step of implanting the ions comprises regulating the speed of the ions impinging on said semiconductor such that the ions penetrate the thin exposed insulating layer but not the thick insulating layer or the gate electrode.

7. The method of claim 5 wherein said first conductivity type is N-type and wherein the ions are phosphorus ions.

8. The method of claim 5 wherein said first conductivity type is P-type and wherein the ions are boron ions.

9. In a method of manufacturing a metal oxide semiconductor of the type formed by doping a substrate of a first conductivity type with second conductivity type determining impurities to form separate source and drain regions therein which are separated by a channel region having a length equal to the space between the source and the drain and a width equal to the interface between the source or drain and the channel region, having a thin insulating layer covering the substrate, and a metallic gate electrode formed over the entire length and a portion only of the width of the channel region such that part of the thin insulating layer overlying the channel region is exposed, the improvement comprising the step of implanting ions of the first conductivity determining type in the substrate at the areas covered by said exposed thin insulating layer to prevent an uncontrollable conducting path from forming between the source and the drain caused by the exposed insulating layer in the channel region.

10. The method of claim 1 wherein said first conductivity type is N-type and wherein the ions are arsenic ions.

11. The method of claim 5 wherein said first conductivity type is N-type and wherein the ions are arsenic ions.

12. The method of claim 1 wherein said first conductivity type is P-type and wherein the ions are gallium ions.

13. The method of claim 1 wherein said first conductivity type is P-type and wherein the ions are indium ions.

14. The method of claim 5 wherein said first conductivity type is P-type and wherein the ions are gallium ions.

15. The method of claim 5 wherein said first conductivity type is P-type and wherein the ions are indium ions.

* * * * *